(12) United States Patent
Paek et al.

(10) Patent No.: US 10,734,606 B2
(45) Date of Patent: Aug. 4, 2020

(54) ELECTROLUMINESCENT DISPLAY APPARATUS

(71) Applicant: LG Display Co., Ltd., Seoul (KR)

(72) Inventors: SeungHan Paek, Paju-si (KR); HoJin Ryu, Paju-si (KR); YoungMu Oh, Paju-si (KR); Dongkyun Woo, Paju-si (KR); Suphil Kim, Paju-si (KR); Seonghyun Kim, Paju-si (KR); Jonghoon Yeo, Paju-si (KR); Jihoon Lee, Paju-si (KR); Changyong Gong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 59 days.

(21) Appl. No.: 16/208,414

(22) Filed: Dec. 3, 2018

(65) Prior Publication Data

US 2019/0189960 A1    Jun. 20, 2019

(30) Foreign Application Priority Data

Dec. 20, 2017 (KR) .................. 10-2017-0176258

(51) Int. Cl.
*H01L 51/52* (2006.01)
*H01L 51/56* (2006.01)
*H01L 27/32* (2006.01)

(52) U.S. Cl.
CPC ........ *H01L 51/5253* (2013.01); *H01L 27/323* (2013.01); *H01L 27/3211* (2013.01); *H01L 27/3246* (2013.01); *H01L 51/5218* (2013.01); *H01L 51/5234* (2013.01); *H01L 51/56* (2013.01)

(58) Field of Classification Search
CPC .............. H01L 51/5253; H01L 27/323; H01L 51/5218; H01L 51/56; H01L 27/3211; H01L 27/3246; H01L 51/5234; H01L 27/3244
See application file for complete search history.

(56) References Cited

U.S. PATENT DOCUMENTS

| 10,032,835 B2 | 7/2018 | Min et al. |
| 2017/0117500 A1* | 4/2017 | Gunji ............... H01L 51/5231 |
| 2017/0222173 A1* | 8/2017 | Matsusue .......... H01L 51/5044 |

FOREIGN PATENT DOCUMENTS

| KR | 10-2015-0011231 A | 1/2015 |
| KR | 10-2015-0077178 A | 7/2015 |

* cited by examiner

*Primary Examiner* — Bac H Au
(74) *Attorney, Agent, or Firm* — Seed IP Law Group LLP

(57) ABSTRACT

Disclosed is an electroluminescent display apparatus. The electroluminescent display apparatus includes a partition provided to define an emission area on a first substrate, a light emitting layer provided in the emission area, an electrode provided on the light emitting layer; and an organic cover layer provided on the electrode. The organic cover layer includes hexaazatriphenylene hexacarbonitrile. The organic cover layer including hexaazatriphenylene hexacarbonitrile is provided on the electrode, and, thus, in a process of forming the organic cover layer, the occurrence of foreign materials is reduced, and cracks are prevented from occurring in the organic cover layer when the foreign materials are pressed.

17 Claims, 4 Drawing Sheets

ELECTROLUMINESCENT DISPLAY APPARATUS

CROSS-REFERENCE TO RELATED APPLICATIONS

This application claims the benefit of the Korean Patent Application No. 10-2017-0176258 filed on Dec. 20, 2017, which is hereby incorporated by reference as if fully set forth herein.

BACKGROUND

Technical Field

The present disclosure relates to an electroluminescent display apparatus, and, more particularly, to an electroluminescent display apparatus in which a defect caused by a foreign material is reduced.

Description of the Related Art

An electroluminescent display apparatus has a structure in which a light emitting layer is formed between two electrodes, and the light emitting layer emits light by an electric field between the two electrodes to display an image.

The light emitting layer may be formed of an organic material which emits light as excitons are generated by the combination of electrons and holes, and dropped from an exited state to a ground state, or may be formed of an inorganic material such as quantum dot.

Hereinafter, a related art electroluminescent display apparatus will be described with reference to the drawings.

FIG. 1 is a schematic cross-sectional view of the related art electroluminescent display apparatus.

As illustrated in FIG. 1, the related art electroluminescent display apparatus includes a first substrate 10, a circuit element layer 20, a first electrode 30, a partition 40, a light emitting layer 50, a second electrode 60, a passivation layer 70, a filling layer 80, and a second substrate 90.

The circuit element layer 20 is formed on the first substrate 10. Various signal lines, thin film transistors (TFTs), capacitors, and the like, are formed in the circuit element layer 20.

The first electrode 30 is formed on the circuit element layer 20. The first electrode 30 is patterned and formed by each pixel and serves as an anode of the electroluminescent display apparatus.

The partitions 40 have a matrix structure to define emission areas.

The light emitting layer 50 is formed in an emission area defined by the partition 40.

The second electrode 60 is formed on the light emitting layer 50. The second electrode 60 serves as a cathode of the electroluminescent display apparatus.

The passivation layer 70 is formed on the second electrode 60 and protects the second electrode 60.

The filling layer 80 is formed between the passivation layer 70 and the second substrate 90.

The second substrate 90 is formed on the filling layer 80.

In the related art electroluminescent display apparatus, a foreign material f may occur during a manufacturing process, and such a foreign material f may exist on the passivation layer 70. The passivation layer 70 is formed of silicon nitride or silicon oxide. When such a silicon nitride or silicon oxide is formed by a deposition process, the foreign material f occurs due to process characteristics, and may fall to the passivation layer 70 so as to be present on the passivation layer 70.

With the foreign material f present on the passivation layer 70, if the filling layer 80 is formed and the second substrate 90 is formed thereon, the foreign material f may be pressed during a pressing process and cause damage (crack) to the passivation layer 70. When cracks are formed in the passivation layer 70, the filling layer 80 may penetrate into the second electrode 60 through the cracks to damage the second electrode, and depending on the case, the filling layer 80 may pass through the second electrode 60 and contaminate even the light emitting layer 500, causing an element defect.

BRIEF SUMMARY

Accordingly, the present disclosure is directed to provide an electroluminescent display apparatus that substantially obviates one or more problems due to limitations and disadvantages of the related art.

An aspect of the present disclosure is directed to provide an electroluminescent display apparatus in which a second electrode is not damaged or a light emitting layer is not contaminated due to pressing of a foreign material.

Additional advantages and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof, as well as the appended drawings.

To achieve these and other advantages and in accordance with the purpose of the disclosure, as embodied and broadly described herein, there is provided an electroluminescent display apparatus including a partition provided to define an emission area on a first substrate, a light emitting layer provided in the emission area, an electrode provided on the light emitting layer, and an organic cover layer provided on the electrode, wherein the organic cover layer includes hexaazatriphenylene hexacarbonitrile (HATCN).

In another aspect of the present disclosure, there is provided an electroluminescent display apparatus including a first substrate and a second substrate including an active area displaying an image and a dummy area provided on an outer portion of the active area and facing each other, partitions defining an emission area in the active area and defining a dummy emission area in the dummy area, a light emitting layer provided in the emission area and a dummy light emitting layer provided in the dummy emission area, an electrode provided on the light emitting layer and the dummy light emitting layer, and an organic cover layer provided on the electrode, wherein the organic cover layer has a crystalline particle structure.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
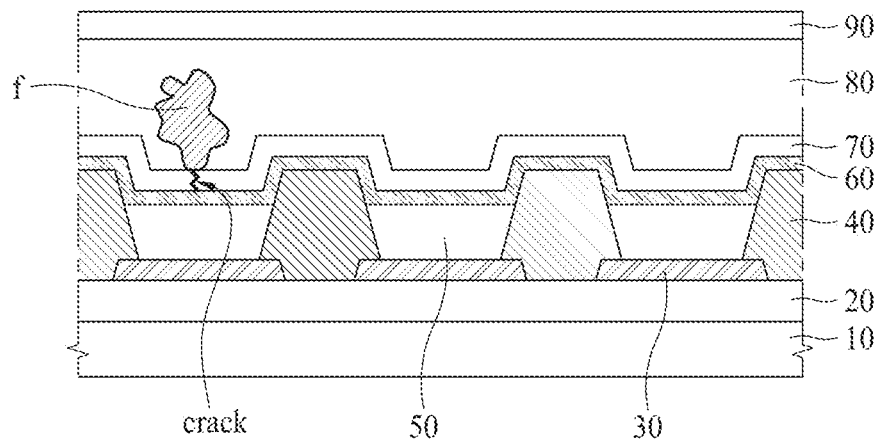
FIG. 1 is a schematic cross-sectional view of the related art electroluminescent display apparatus.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof, will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and, thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically, as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
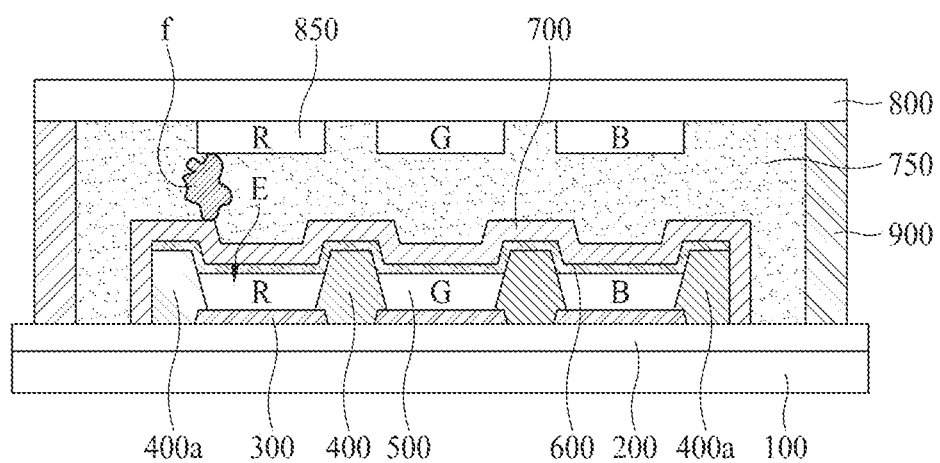
FIG. 2 is a schematic cross-sectional view of an electroluminescent display apparatus according to an embodiment of the present disclosure.

FIG. 2 is a schematic cross-sectional view of an electroluminescent display apparatus according to an embodiment of the present disclosure.

As illustrated in FIG. 2, an electroluminescent display apparatus according to an embodiment of the present disclosure includes a first substrate 100, a circuit element layer 200, a first electrode 300, a partition 400, a light emitting layer 500, a second electrode 600, an organic cover layer 700, a filling layer 750, a second substrate 800, a color filter layer 850, and a wall structure 900.

The first substrate 100 may be formed of glass or plastic but is not limited thereto. The first substrate 100 may be formed of a transparent material or an opaque material. The electroluminescent display apparatus according to an embodiment of the present disclosure may be a top emissive type in which emitted light is emitted toward the upper side, and accordingly, an opaque material, as well as a transparent material, may be used as a material of the first substrate 100.

The circuit element layer 200 is formed on the first substrate 100.

In the circuit element layer 200, circuit elements including various signal lines, thin film transistors (TFTs), capacitors, and the like, are provided by pixels. The signal lines may include gate lines, data lines, power lines, and reference lines, and the thin film transistors may include a switching TFT, a driving TFT, and a sensing TFT.

The switching TFT is switched according to a gate signal supplied to a gate line, and supplies a data voltage supplied from the data line to the driving TFT.

The driving TFT is switched according to a data voltage supplied from the switching TFT to generate a data signal from a power source supplied from the power line, and supply the generated data signal to the first electrode 300.

The sensing TFT serves to sense a threshold voltage deviation of the driving TFT which causes deterioration of image quality. The sensing TFT supplies current of the driving TFT to the reference line in response to a sensing control signal supplied from the gate line or a separate sensing line.

One or more capacitors serve to maintain a data voltage supplied to the driving TFT for one frame. The one or more capacitors are connected to each of a gate terminal and a source terminal of the driving TFT.

The first electrode 300 is formed on the circuit element layer 200.

The first electrode 300 may be patterned and formed for each pixel and serve as an anode of the electroluminescent display apparatus. The first electrode 300 is connected to the driving TFT provided in the circuit element layer 200.

The electroluminescent display apparatus according to an embodiment of the present disclosure may be a top emission type electroluminescent display apparatus, and accordingly, the first electrode 300 may include a reflective material for upwardly reflecting light emitted from the light emitting layer 500. In this case, the first electrode 300 may have a structure in which a transparent conductive material and the reflective material are stacked.

Each partition 400 is formed at the boundary between a plurality of pixels. That is, the partitions 400 are formed in a matrix structure as a whole to define an emission area E in the plurality of pixels. Therefore, the partition 400 is formed at the boundary around the plurality of emission areas E. The emission areas E are formed between adjacent partitions 400. The partitions 400 are elevated formations extending upwardly from the circuit element layer 200 above the light emitting layer 500.

The partition 400 is formed on the circuit element layer 200, while covering both ends or a periphery of the first electrode 300. Accordingly, a plurality of first electrodes 300 patterned and formed for each of a plurality of pixels may be insulated by the partitions 400.

The light emitting layer 500 is formed on the first electrode 300. The light emitting layer 500 is formed in each of the plurality of emission areas E.

The light emitting layer 500 may include a red (R) light emitting layer, a green (G) light emitting layer, and/or a blue (B) light emitting layer provided in each emission area (E). The light emitting layer 500 may include a white light emitting layer provided in each emission area E.

The light emitting layer 500 may be patterned for each emission area E by evaporation using a mask or patterned for each emission area E without a mask through a solution process using ink jet equipment, or the like. The light emitting layer 500 may be formed by evaporation without masking the boundary between adjacent emission areas E. In this case, the light emitting layer 500 may be formed even on the partition 400, as well as on the first electrode 300, and the light emitting layer 500 may be formed of a white light emitting layer.

The light emitting layer 500 may include at least one of a hole injecting layer, a hole transporting layer, an organic emitting layer, an electron transporting layer, and an electron injecting layer.

The second electrode 600 is formed on the light emitting layer 500 and may serve as a cathode of an electroluminescent display apparatus.

The second electrode 600 may be formed not only on the light emitting layer 500 but also on the partition 400, and may be formed on the plurality of emission areas E and the boundary areas therebetween. Therefore, the second electrode 600 may serve as a common electrode for applying a common voltage to a plurality of pixels.

The electroluminescent display apparatus according to an embodiment of the present disclosure may be configured as a top emission type, and accordingly, the second electrode 600 may be formed of a transparent conductive material allowing light emitted from the light emitting layer 500 to be transmitted upwards, or may be thin to increase transmittance. In this case, in order to reduce resistance of the transparent conductive material, an auxiliary electrode having excellent electrical conductivity may be connected to the second electrode 600.

The organic cover layer 700 is formed on the second electrode 600. Specifically, the organic cover layer 700 covers the entire upper surface of the second electrode 600. The organic cover layer 700 may extend along a side surface of the second electrode 600 and a side surface of the outermost partition 400a to an upper surface of the circuit element layer 200 partition. The organic cover layer 700 serves to block or otherwise prevent the filling layer 750 from penetrating into the second electrode 600. Therefore, the organic cover layer 700 may be formed between the filling layer 750 and the second electrode 600 to prevent the filling layer 750 from being in contact with the second electrode 600.

The organic cover layer 700 has soft characteristics relative to an inorganic material. Therefore, although a foreign material f may be present on or in the organic cover layer 700, and the organic cover layer 700 is pressed by the foreign material f in the process of attaching the first substrate 100 and the second substrate 800, it is less likely that damage such as cracks will occur in the organic cover layer 700 as a result of the presence of the foreign material f.

In particular, according to an embodiment of the present disclosure, the organic cover layer 700 includes hexaazatriphenylene hexacarbonitrile (HATCN). The HATCN is a material represented by Chemical Formula 1 below.

[Chemical Formula 1]

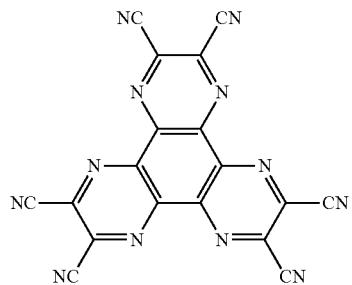

Since the HATCN may be deposited as a thin layer using evaporation, the occurrence of the foreign material f is reduced when the organic cover layer 700 is formed of the HATCN.

An inorganic material, such as silicon nitride or silicon oxide, is generally deposited as a thin layer using a chemical vapor deposition (CVD) method. When the chemical vapor deposition method is used, a relatively large amount of foreign material f may occur, and, thus, the possibility of cracking of the thin layer due to pressing of the foreign material f is high.

In contrast, the use of the evaporation method reduces the possibility of the occurrence of the foreign material f, rather than the CVD method, and accordingly, the possibility of cracking of the thin layer due to pressing of the foreign material f is small. In the case of the present disclosure, since the organic cover layer 700 includes HATCN and is formed using the evaporation method, the possibility of cracking of the organic cover layer 700 due to the presence of the foreign material f is relatively small.

Further, the HATCN particle structure exhibits superior stability relative to general organic materials, and, thus, the possibility of cracking due to pressing of the foreign material f is reduced. In particular, when a deposition thickness of the HATCN is appropriately controlled, HATCN having a crystalline particle structure may be obtained, and, thus, an effect of preventing or reducing a likelihood of cracking due to pressing of the foreign material f is achieved.

The particle structure of the HATCN according to deposition thicknesses will be described with reference to FIGS. 3A and 3B.

Figure 3A:
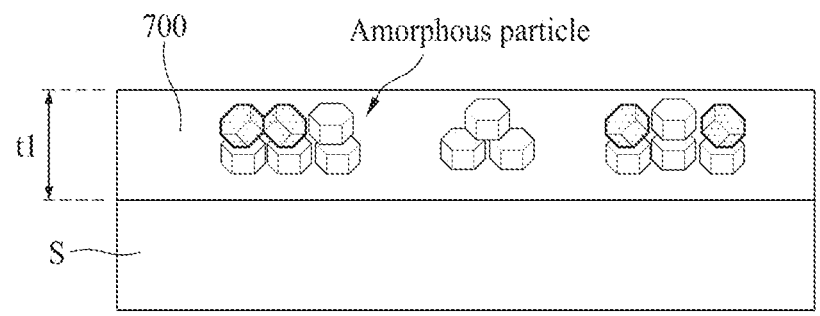
FIGS. 3A and 3B are schematic views illustrating a particle structure of each deposition thickness of HATCN by deposition thicknesses according to the present disclosure.
Figure 3B:
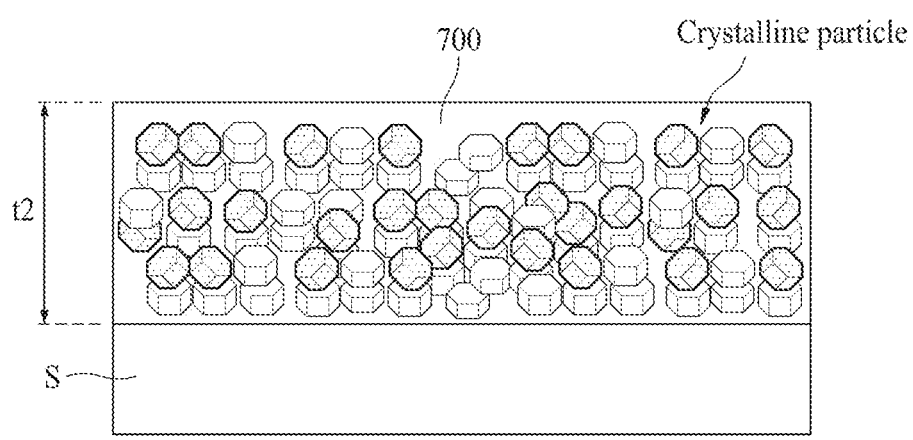

FIGS. 3A and 3B are schematic diagrams illustrating particle structures of HATCN according to deposition thicknesses according to the present disclosure, schematizing results of crystallization analysis using X-ray scattering on the deposited HATCN.

FIG. 3A illustrates a particle structure of a HATCN when the HATCN is deposited to have a first thickness t1 on a substrate S, and FIG. 3B illustrates a particle structure of a HATCN when the HATCN is formed on the substrate S to have a second thickness t2 greater than the first thickness t1 on the substrate S.

In the case of FIG. 3A, connection characteristics between HATCN particles is weak, having an amorphous particle structure. In the case of FIG. 3B, connection characteristics between HATCN particles is strong, having a crystalline particle structure. Therefore, the HATCN may be appropriately adjusted in thickness to have a crystalline particle structure. When the organic cover layer 700 includes HATCN having a crystalline particle structure, the occurrence of cracks due to pressing of the foreign material f may be reduced or prevented. According to experimental data obtained in connection with the technologies described herein, HATCN having a crystalline particle structure is achieved when a deposition thickness of HATCN is 30 nm or greater. Therefore, it is preferable that the thickness of the organic cover layer 700 including HATCN is 30 nm or greater. The crystallinity of the HATCN particle structure increases as the thickness of the organic cover layer 700 including HATCN increases. However, when the thickness exceeds 200 nm, the effect of improving crystallization may not be large, and a deposition time and material cost increase. Therefore, it may be preferable that the thickness of the organic cover layer 700 including HATCN is set to 200 nm or less. As a result, a thickness of the organic cover layer 700 including HATCN may be between 30 nm and 200 nm, inclusive.

The filling layer 750 is formed on the organic cover layer 700. The filling layer 750 is formed between an upper surface of the organic cover layer 700 and a lower surface of the second substrate 800. The filling layer 750 is also formed between an upper surface of the organic cover layer 700 and a lower surface of the color filter layer 850. Also, the filling layer 750 may be formed between an upper surface of the circuit element layer 200 and a lower surface of the second substrate 800 at the edges of the substrates 100 and 800. As a result, the filling layer 750 may fill a space defined by the wall structure 900, the circuit element layer 200, the organic cover layer 700, the second substrate 800, and the color filter layer 850. The filling layer 750 may be formed of various materials known in the art, for example, an organic material.

The second substrate 800 is disposed on a front surface where light is projected to display an image. Accordingly, the second substrate 800 is formed of a transparent material. The second substrate 800 serves to prevent or otherwise inhibit moisture from penetrating into the inside of the second substrate 800. The second substrate 800 may be attached to the circuit element layer 200 of the first substrate 100 by the wall structure 900.

The color filter layer 850 is formed on the second substrate 800. Specifically, the color filter layer 850 is formed on an inner surface of the second substrate 800 facing the first substrate 100. The color filter layer 850 may include one or more of a red color filter R, a green color filter G, and a blue color filter B. Each of the red color filter R, the green color filter G, and the blue color filter B is provided between the light emitting layer 500 and the second substrate 800 at the emission area E of the light emitting layer 500.

The red color filter R, the green color filter G, and the blue color filter B may be spaced apart from each other, but a relative positioning of the filters is not necessarily limited thereto. The red color filter R, the green color filter G, and the blue color filter B may be in contact with each other or may overlap each other at the end in some cases. Although not specifically shown, a black matrix may be additionally formed between the red color filter R, the green color filter G, and the blue color filter B to prevent light leakage from occurring at the pixel boundary.

In some cases, the color filter layer 850 may be omitted. When the light emitting layer 500 includes a red (R) light emitting layer, a green (G) light emitting layer, and a blue (B) light emitting layer, the color filter layer 850 is not necessarily required. In this case, however, the color filter layer 850 may be additionally provided to improve color purity of each pixel.

The wall structure 900 is formed at the edges of the first substrate 100 and the second substrate 800 to attach the first substrate 100 and the second substrate 800. Thus, the wall structure 900 includes an adhesive material.

The wall structure 900 is formed to surround the edges of the first substrate 100 and the second substrate 800 in a shape corresponding to the shape of the substrates 100 and 800 in plan view.

The wall structure 900 may be in contact with the upper surface of the circuit element layer 200 on the first substrate 100 and the lower surface of the second substrate 700. The wall structure 900 prevents the filling layer 750 from flowing out. Therefore, the inside of the electroluminescent display apparatus may be sealed by the wall structure 900.

The wall structure 900 may include a moisture permeation prevention material to prevent moisture from penetrating into the inside of the wall structure 900. The wall structure 900 may be in direct contact with the second substrate 800 and the circuit element layer 200 to improve the moisture permeation prevention effect.

When a third organic material is formed between the wall structure 900 and the second substrate 800, ambient moisture may penetrate to the inside through the third organic material. Therefore, the wall structure 900 is preferably in contact with the lower surface of the second substrate 800. For the same reason, the wall structure 900 is preferably in contact with the upper surface of the circuit element layer 200. In this case, the upper surface of the circuit element layer 200, which is in contact with the lower surface of the wall structure 900, may be formed of an inorganic material to prevent moisture permeation.

Figure 4:
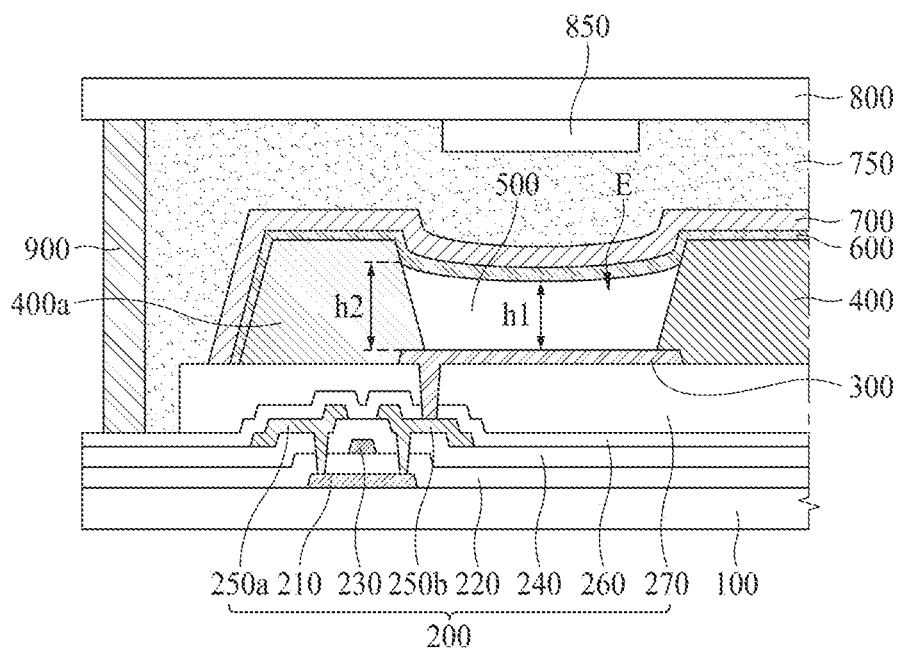
FIG. 4 is a schematic cross-sectional view of an electroluminescent display apparatus according to another embodiment of the present disclosure.

FIG. 4 is a schematic cross-sectional view of an electroluminescent display apparatus according to another embodiment of the present disclosure. FIG. 4, which corresponds to a case where a light emitting layer is formed by a solution process, illustrates only one emission area E for the sake of convenience, unlike the case of FIG. 2 described above.

As illustrated in FIG. 4, the electroluminescent display apparatus according to another embodiment of the present disclosure includes a first substrate 100, a circuit element layer 200, a first electrode 300, a partition 400, a light emitting layer 500, a second electrode 600, an organic cover layer 700, a filling layer 750, a second substrate 800, a color filter layer 850, and a wall structure 900. Hereinafter, only the components different from those of FIG. 2 described above will be described.

The circuit element layer 200 is formed on the first substrate 100 and includes an active layer 210, a gate insulating layer 220, a gate electrode 230, an interlayer insulating layer 240, a source electrode 250a, a drain electrode 250b, a passivation layer 260, and a planarization layer 270.

The active layer 210 is formed on the first substrate 100. The active layer 210 may be formed of a silicon-based semiconductor material or an oxide semiconductor material, but is not limited thereto. Although not shown, a light blocking layer may be additionally provided between the first substrate 100 and the active layer 210 to prevent light from entering the active layer 210, thus preventing deterioration of the active layer 210.

The gate insulating layer 220 is formed on the active layer 210 to insulate the active layer 210 from the gate electrode 230.

The gate electrode 230 is formed on the gate insulating layer 220.

The interlayer insulating layer 240 is formed on the gate electrode 230 to insulate the gate electrode 230 from the source and drain electrodes 250a and 250b.

The source electrode 250a and the drain electrode 250b are spaced apart from each other on the interlayer insulating layer 240 to face each other. The source electrode 250a and the drain electrode 250b are connected to one end and the other end of the active layer 210 through a contact hole provided on the interlayer insulating layer 240 and the gate insulating layer 220, respectively.

The passivation layer 260 is provided on the source electrode 250a and the drain electrode 250b and protects the TFT.

The planarization layer 270 is formed on the passivation layer 260 to planarize a surface above the first substrate 100.

The planarization layer 270 may be formed of an organic material. In this case, the planarization layer 270 may be formed not to be in contact with a lower surface of the wall structure 900. If the planarization layer 270 formed of an organic material extends to below the lower surface of the wall structure 900, ambient moisture may penetrate through the planarization layer 270. However, the planarization layer 270 may be formed such that an end of the planarization layer 270 is in contact with an inner side surface of the wall structure 900. In a case where the planarization layer 270 is formed of an inorganic material, the planarization layer 270 may be formed to be in contact with the lower surface of the wall structure 900.

The passivation layer 260, the interlayer insulating layer 240, and the gate insulating layer 220 may be formed of an inorganic material. In this case, the passivation layer 260, the interlayer insulating layer 240, and the gate insulating layer 220 may extend to below the lower surface of the wall structure 900. In the drawing, it is illustrated that all of the passivation layer 260, the interlayer insulating layer 240, and the gate insulating layer 220 extend below to the lower surface of the wall structure 900, and the lower surface of the wall structure 900 is in contact with the upper surface of the passivation layer 260, but the present disclosure is not limited thereto. For example, the passivation layer 260 may not extend to below the wall structure 900 and the interlayer insulating layer 240 and the gate insulating layer 220 may extend to below the lower surface of the wall structure 900. In such an implementation, the lower surface of the wall structure 900 may be in contact with the upper surface of the interlayer insulating layer 240.

In a case where the lower surface of the wall structure 900 is in contact with the circuit element layer 200, the lower surface of the wall structure 900 may preferably be in contact with a layer formed of an inorganic material in the stacked structure of the circuit element layer 200 to prevent moisture from permeating inside the electroluminescent display apparatus.

The circuit element layer 200 includes a thin film transistor (TFT) including the gate electrode 230, the active layer 210, the source electrode 250a, and the drain electrode 250b. FIG. 4 illustrates a TFT having a top gate structure in which the gate electrode 230 is formed on an active layer 210, but is not limited thereto. A TFT having a bottom gate structure in which the gate electrode 230 is formed below the active layer 210 may also be formed in the circuit element layer 200.

The electroluminescent display apparatus according to an embodiment of the present disclosure may be configured as a top emission type. In this case, the TFT is disposed below the light emitting layer 500, and, thus, light emission is not affected by the TFT.

The first electrode 300 is connected to the drain electrode 250b of the TFT through a contact hole formed in the planarization layer 270 and the passivation layer 260. In some cases, the first electrode 300 may be connected to the source electrode 250a of the TFT through the contact hole formed in the planarization layer 270 and the passivation layer 260.

The partition 400 is formed on the planarization layer 270 of the circuit element layer 200. The partition 400 covers both ends of the first electrode 300.

At least some portions of the partition 400 may be formed of an organic insulating material having hydrophilic properties. In this case, the light emitting layer 500 may easily spread to opposing side surfaces of the partition 400, and may be uniformly formed in the emission area E. If the entirety of the partition 400 has hydrophilic properties, a material of the light emitting layer 500 formed in the emission area E may flow up a side surface, over an upper surface of the partition 400, and into a neighboring emission area E where the partition 400 may be mixed with material of another neighboring light emitting layer 500. Therefore, in order to prevent the neighboring light emitting layers 500 from mixing with each other, the upper surface of the partition 400 may have hydrophobic properties. For instance, a solution mixed with a hydrophobic material, such as fluorine, may be applied to an organic insulating material having hydrophilic properties. Then, the partition 400 may be patterned through a photolithography process in which light is irradiated, causing the hydrophobic material to move to an upper portion of the partition 400. Accordingly, the upper portion of the partition 400 may have hydrophobic properties, whereas the other portions of the partition 400 may have hydrophilic properties. In this case, since the upper surface of the partition 400 has hydrophobic properties, the degree of spread of the light emitting layer 500 to the upper surface of the partition 400 is reduced to prevent or reduce the problem of mixing between the adjacent light emitting layers 500.

The light emitting layer 500 is formed in the emission area E defined by the partition 400. The light emitting layer 500 is patterned in each emission area E through an ink jet process, without a mask. In this case, after the solution for the light emitting layer 500 is dried, a height h1 of an upper end of the light emitting layer 500 at the center of the emission area E may be lower than a height h2 of an upper end of the light emitting layer 500 at the end of the emission area E—specifically, at the end in contact with the partition 400. In particular, as illustrated, the light emitting layer 500 may have a profile in which the height of the light emitting layer 500 gradually decreases from the end of the emission area E in contact with the partition 400 toward the center of the emission area E. Accordingly, a portion of the second electrode 600 formed on the light emitting layer 500 is formed to have a profile corresponding to the profile of the light emitting layer 500.

The second electrode 600 is formed not only on the light emitting layer 500 but also on the partition 400. In particular, the second electrode 600 may extend from the light emitting layer 500 to an upper surface of the planarization layer 270 of the circuit element layer 200 and along a side surface of the outermost partition 400a.

The organic cover layer 700 is formed on an upper surface of the second electrode 600. Specifically, the organic cover layer 700 is formed on the upper surface of a portion of the second electrode 600 provided on the upper surface of the partition 400 and the upper surface of the light emitting layer 500. The organic cover layer 700 is also formed on a portion of the second electrode 600 provided on the side surface of the outermost partition 400a. The organic cover layer 700 may extend to the upper surface of the planarization layer 270. However, the organic cover layer 700 is formed not to be in contact with the wall structure 900, thereby preventing degradation of moisture permeation preventing effect in the area where the wall structure 900 is formed. That is, the end of the organic cover layer 700 may be located on the planarization layer 270, and may not extend to the wall structure 900. Accordingly, the wall structure 900 may be spaced apart from the organic cover layer 700.

The filling layer 750 is formed on the circuit element layer 200 at the edges of one or both of the substrates 100 and 800. In particular, in a case where the planarization layer 270 and the wall structure 900 are spaced apart from each other, the filling layer 750 fills the area between the planarization layer 270 and the wall structure 900.

The wall structure 900 may be in contact with the upper surface of the passivation layer 260 and the lower surface of the second substrate 800. However, as described above, the configuration of the circuit element layer 200 may be variously modified in an area below the wall structure 900. Accordingly, the lower surface of the wall structure 900 may be in contact with the interlayer insulating layer 240 or the gate insulating layer 220 of the circuit element layer 200.

Figure 5:
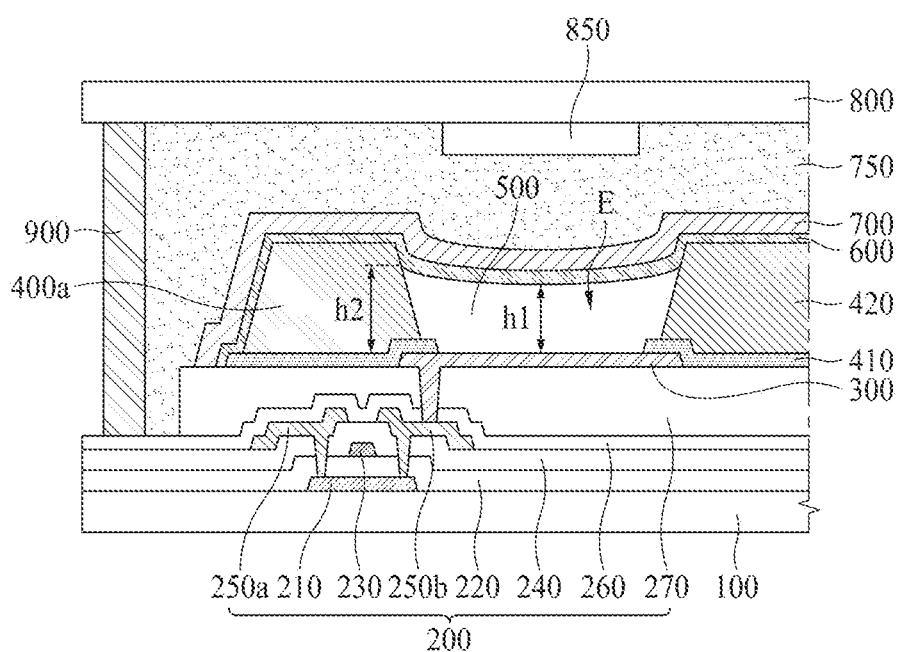
FIG. 5 is a schematic cross-sectional view of an electroluminescent display apparatus according to another embodiment of the present disclosure.

FIG. 5 is a schematic cross-sectional view of an electroluminescent display apparatus according to another embodiment of the present disclosure. The embodiment of FIG. 5 is the same as the electroluminescent display apparatus according to FIG. 4 except that the configuration of the partition 400 is changed. Therefore, the same reference numerals are given to the same components, and only the different components will be described below.

As illustrated in FIG. 5, the partition 400 includes a first partition portion 410 and a second partition portion 420.

The first partition portion 410 is formed on the circuit element layer 200 and covers an end of the first electrode 300. The first partition portion 410 is formed to be thinner than the second partition portion 420 and to have a width larger than that of the second partition portion 420. The first partition portion 410 may have the same or similar hydrophilic properties as the light emitting layer 500. For instance, the first partition portion 410 having the hydrophilic properties may be formed of an inorganic insulating material, such as silicon oxide. Therefore, when the light emitting layer 500 is formed by an inkjet process, a solution having hydrophilic properties may be spread on the first partition portion 410.

The second partition portion 420 is formed on the first partition portion 410. The second partition portion 420 is formed to have a narrower width than the first partition portion 410. The second partition portion 420 may be formed by applying a solution mixed with a hydrophobic material, such as fluorine, to an organic insulating material having hydrophilic properties. Then, the second partition portion 420 may be patterned through a photolithography process in which light is irradiated onto the second partition portion 420, causing the hydrophobic material to move to an upper portion of the second partition portion 420. Accordingly, the upper portion of the second partition portion 420 has hydrophobic properties, whereas the other portions of the second partition portion 420 have hydrophilic properties. That is, the lower portion of the second partition portion 420 in contact with the first partition portion 410 has hydrophilic properties, and the upper portion of the second partition portion 420 has hydrophobic properties. However, the present disclosure is not limited thereto, and the entirety of the second partition portion 420 may have hydrophobic properties.

The hydrophilic properties of the first partition portion 410 and the lower portion of the second partition portion 420 may improve the capacity of the solution for forming the light emitting layer 500 to be distributed in the emission area E. In particular, since the first partition portion 410 is formed to have a smaller thickness and a larger width than the second partition portion 420, a two-step structure having hydrophilic properties is provided by the combination of the first partition portion 410 and the second partition portion 420, the solution for forming the light emitting layer 500 may be easily spread to left and right ends of the emission area E.

Also, since the solution for forming the light emitting layer 500 is prevented from spreading to an adjacent emission area E by the upper portion of the second partition portion 420 having the hydrophobic properties, the comingling of light emitting layers 500 is prevented between adjacent emission areas E.

Figure 6:
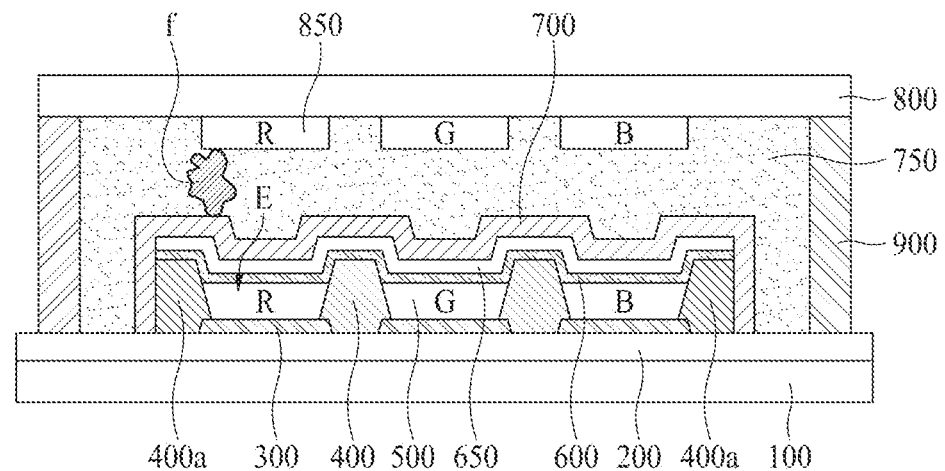
FIG. 6 is a schematic cross-sectional view of an electroluminescent display apparatus according to another embodiment of the present disclosure.

FIG. 6 is a schematic cross-sectional view of an electroluminescent display apparatus according to another embodiment of the present disclosure. The embodiment of FIG. 6 is the same as the electroluminescent display apparatus according to FIG. 2 described above, except that a capping layer 650 is additionally included between the second electrode 600 and the organic cover layer 700. Therefore, the same reference numerals are given to the same components, and only the different components will be described below.

As illustrated in FIG. 6, the capping layer 650 is provided between the second electrode 600 and the organic cover layer 700. That is, a lower surface of the capping layer 650 is in contact with the upper surface of the second electrode 600 and an upper surface of the capping layer 650 is in contact with the lower surface of the organic cover layer 700.

The capping layer 650 covers the upper surface of the second electrode 600 and protects the upper surface of the second electrode 600. In the structure of FIG. 6, the second electrode 600 may be dually protected by the capping layer 650 and the organic cover layer 700. Thus, although pressing may occur due to the presence of the foreign material f, the capping layer 650 helps to prevent penetration of the filling layer 750 into the second electrode 620. The capping layer 650 may include an organic material and may be formed by an evaporation method.

The organic cover layer 700 may extend from an upper surface of the capping layer 650 along a side surface of the capping layer 650, along a side surface of the second electrode 600, along a side surface of the outermost partition 400a, and to an upper surface of the circuit element layer 200.

Although not shown, the capping layer 650 may be additionally provided between the second electrode 600 and the organic cover layer 700 in the structures according to FIGS. 4 and 5 described above.

Figure 7:
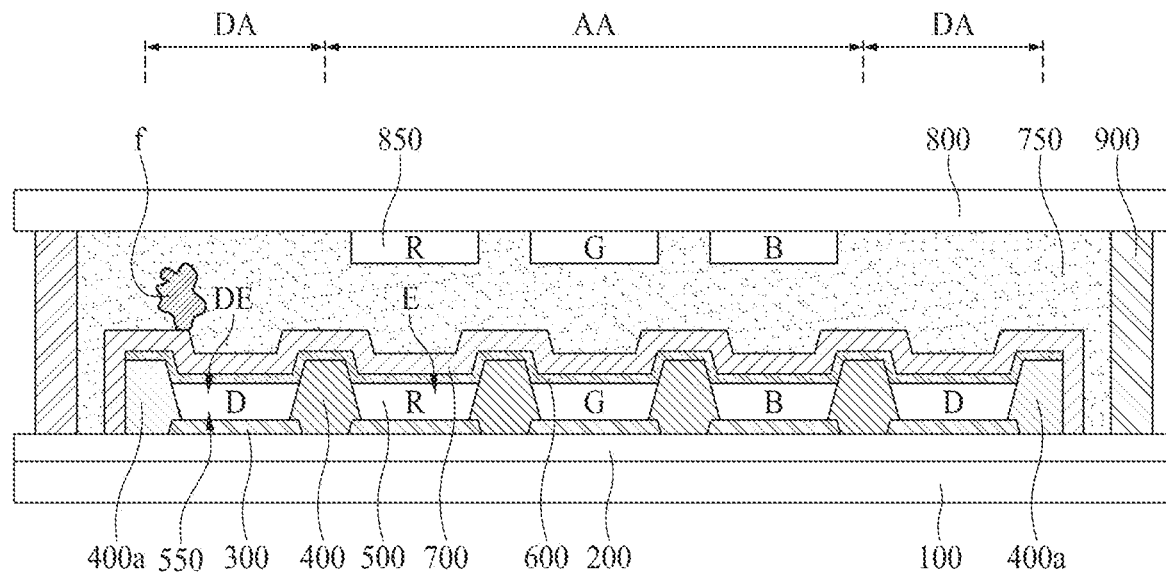
FIG. 7 is a schematic cross-sectional view of an electroluminescent display apparatus according to another embodiment of the present disclosure.

FIG. 7 is a schematic cross-sectional view of an electroluminescent display apparatus according to another embodiment of the present disclosure, which relates to an electroluminescent display apparatus including an active area AA and a dummy area DA.

The active area AA serves as a display area generating image light for displaying an image. The dummy area DA is provided to surround the active area AA. Specifically, the dummy area DA is provided on upper, lower, left and right outer portions of the active area AA in plan view.

The active area AA has includes one or more emission areas E respectively defined by the partition 400, and the respective emission areas E have the light emitting layer 500. The dummy area DA includes a dummy emission area DE defined by the partition 400, and the dummy emission area DE has a dummy light emitting layer 550.

Since the dummy area DA is not a display area for displaying an image, light emission does not occur in the dummy emission area DE provided in the dummy area DA. During formation of the light emitting layer 500 through a solution process, a drying rate of the light emitting layer 500 may be different between the center and the edges of the substrate. Therefore, in a case where only the active area AA is provided without the dummy area DA, a profile of the light emitting layer 500 at the center of the active area AA and a profile of the light emitting layer 500 at the edge of the active area AA may not be uniform. As a result, emission at the center of the active area AA and emission at the edge of the active area AA may not be uniform. Therefore, in another embodiment of the present disclosure, the dummy area DA is formed at an outer portion of the active area AA and, during formation of the light emitting layer 500 in the active area AA through the solution process, the dummy light emitting layer 550 is also formed in the dummy area DA through the solution process. The profile of the light emitting layer 500 may be uniform in the entire active area AA even though the profile of the dummy light emitting layer 550 and the profile of the light emitting layer 500 may not be uniform. For reference, in FIG. 7, the dummy light emitting layer 550, which does not emit light, is indicated by D, so as to be distinguished from the light emitting layer 500, which emits red (R), green (G), and blue (B).

The electroluminescent display apparatus according to another embodiment of the present disclosure includes the first substrate 100, the circuit element layer 200, the first electrode 300, the partition 400, the light emitting layer 500, the dummy light emitting layer 550, the second electrode 600, the organic cover layer 700, the filling layer 750, the second substrate 800, the color filter layer 850, and the wall structure 900.

The circuit element layer 200 is formed in the active area AA and the dummy area DA. The circuit element layer 200 may be formed and have the same structure through the same process in the active area AA and the dummy area DA. However, the present disclosure is not limited thereto. For instance, the circuit element layer 200 formed in the dummy area DA may not include some of signal lines such as the gate line, the data line, the power line, and the reference line. As another example, the circuit element layer 200 may not have some of the switching TFT and the driving TFT, so that light emission may not occur in the dummy area DA. In some cases, the circuit element layer 200 formed in the dummy area DA may be incompletely configured so that either the switching TFT or the driving TFT does not operate.

The first electrode 300 is formed in the active area AA and the dummy area DA. The first electrode 300 may be formed and have the same structure through the same process in the active area AA and the dummy area DA. However, the first electrode 300 may not be formed in the dummy area DA, and, thus, light emission may not occur in the dummy area DA.

The partition 400 is formed in the active area AA and the dummy area DA. The partition 400 may be formed and have the same structure through the same process in the active area AA and the dummy area DA.

The light emitting layer 500 is formed in the active area AA, and the dummy light emitting layer 550 is formed in the dummy area DA. The dummy light emitting layer 550 may have the same structure as that of the light emitting layer 500, or, in some cases, the dummy light emitting layer 550 may have a structure different from that of the light emitting layer 500.

The second electrode 600 is formed in the active area AA and the dummy area DA. The second electrode 600 may be formed and have the same structure through the same process in the active area AA and the dummy area DA.

The organic cover layer 700 is formed in the active area AA and the dummy area DA. The organic cover layer 700 may extend from the upper surface of the second electrode 600, which is provided in the active area AA and the dummy area DA, along the side surface of the outermost partition 400a provided in the dummy area DA, to the upper surface of the circuit element layer 200 provided in the dummy area DA. In some embodiments, the organic cover layer 700 is not formed in the dummy area DA. If moisture penetrates into the dummy area DA in such embodiments, it may not cause a problem, such as a defective element, because the dummy area DA is not an area for displaying an image. However, if moisture penetrates into the dummy area DA, the moisture may spread to the active area AA, and, thus, preferably, the organic cover layer 700 is formed in the dummy area DA.

The filling layer 750 fills the inner side of the wall structure 900, and, thus, the filling layer 750 is formed in both the active area AA and the dummy area DA.

The color filter layer 850 may be formed in the active area AA and may not be formed in the dummy area DA. However, the color filter layer 850 may also be formed in the dummy area DA.

The wall structure 900 is formed on or near an outer portion of the dummy area DA and attaches the first substrate 100 and the second substrate 800 together.

Although not shown, the capping layer 650 as illustrated in FIG. 6 may be additionally provided between the second electrode 600 and the organic cover layer 700. In addition, the structure of the circuit element layer 200, the partition 400, and the light emitting layer 500 may be varied as illustrated in FIGS. 4 and 5.

According to an embodiment of the present disclosure, the organic cover layer including hexaazatriphenylene hexacarbonitrile is provided on the electrode, and, thus, in a process of forming the organic cover layer, the occurrence of foreign materials is reduced and cracks are prevented from occurring in the organic cover layer when the foreign materials are pressed. Therefore, a problem that the filling layer, which may be provided on the organic cover layer, penetrates into the electrode or the light emitting layer to cause a device failure is reduced.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display apparatus comprising:
a first substrate;
a partition provided on the first substrate and defining an emission area of the electroluminescent display apparatus;
a light emitting layer provided in the emission area;
an electrode provided on the light emitting layer; and
an organic cover layer provided on the electrode,
wherein the organic cover layer includes hexaazatriphenylene hexacarbonitrile.

2. The electroluminescent display apparatus of claim 1, wherein the hexaazatriphenylene hexacarbonitrile is formed to have a crystalline particle structure.

3. The electroluminescent display apparatus of claim 1, wherein a thickness of the organic cover layer is between 30 nm to 200 nm, inclusive.

4. The electroluminescent display apparatus of claim 1, wherein
the electrode is provided on an upper surface of the partition, and
the organic cover layer extends from an upper surface of the electrode along a side surface of the electrode and a side surface of an outermost partition.

5. The electroluminescent display apparatus of claim 1, further comprising:
a filling layer provided on the organic cover layer;
a second substrate provided on the filling layer; and
a wall structure attaching the first substrate and the second substrate at edges of the first substrate and the second substrate.

6. The electroluminescent display apparatus of claim 5, wherein the wall structure is spaced apart from the organic cover layer.

7. The electroluminescent display apparatus of claim 5, further comprising:
a circuit element layer provided between the first substrate and the light emitting layer,
wherein the wall structure extends between the second substrate and the circuit element layer.

8. The electroluminescent display apparatus of claim 7, wherein the wall structure is in contact with a lower surface of the second substrate and an upper surface of the circuit element layer, and the upper surface of the circuit element layer in contact with the wall structure is formed of an inorganic material.

9. The electroluminescent display apparatus of claim 1, further comprising a capping layer provided between the electrode and the organic cover layer.

10. The electroluminescent display apparatus of claim 9, wherein the organic cover layer extends from an upper surface of the capping layer along a side surface of the capping layer and along a side surface of the electrode.

11. An electroluminescent display apparatus comprising:
a first substrate having an active area for displaying an image and a dummy area provided at an outer portion of the active area;
a partition provided on the first substrate and separating an emission area in the active area from a non-emission area in the dummy area;
a light emitting layer provided in the emission area;
a dummy layer provided in the non-emission area;
an electrode provided on the light emitting layer and the dummy layer; and
an organic cover layer provided on the electrode,
wherein the organic cover layer has a crystalline particle structure.

12. The electroluminescent display apparatus of claim 11, wherein the organic cover layer includes hexaazatriphenylene hexacarbonitrile.

13. The electroluminescent display apparatus of claim 12, wherein a thickness of the organic cover layer is between 30 nm and 200 nm, inclusive.

14. The electroluminescent display apparatus of claim 11, wherein
the electrode is provided on an upper surface of the partition, and
the organic cover layer extends from an upper surface of the electrode along a side surface of the electrode and a side surface of an outermost partition.

15. The electroluminescent display apparatus of claim 11, further comprising:
a filling layer provided on the organic cover layer;
a second substrate provided on the filling layer; and
a wall structure attaching the first substrate to the second substrate at edges of the first substrate and the second substrate,
wherein the wall structure is spaced apart from the organic cover layer.

16. The electroluminescent display apparatus of claim 11, further comprising:
a second substrate provided on the filling layer;
a wall structure attaching the first substrate to the second substrate; and
a circuit element layer provided between the first substrate and the dummy layer,
wherein the wall structure is in contact with a lower surface of the second substrate and an upper surface of the circuit element layer, and the upper surface of the circuit element layer in contact with the wall structure is formed of an inorganic material.

17. The electroluminescent display apparatus of claim 11, further comprising a capping layer provided between the electrode and the organic cover layer.

* * * * *

UNITED STATES PATENT AND TRADEMARK OFFICE
CERTIFICATE OF CORRECTION

PATENT NO. : 10,734,606 B2
APPLICATION NO. : 16/208414
DATED : August 4, 2020
INVENTOR(S) : SeungHan Paek et al.

It is certified that error appears in the above-identified patent and that said Letters Patent is hereby corrected as shown below:

On the Title Page

Item (54) and in the Specification, Column 1 Lines 1-2:
"ELECTROLUMINESCENT DISPLAY APPARATUS"
Should read:
--ELECTROLUMINESCENCE DISPLAY APPARATUS--

Signed and Sealed this
Tenth Day of November, 2020

Andrei Iancu
*Director of the United States Patent and Trademark Office*